US006961273B2

(12) United States Patent
Boldt et al.

(10) Patent No.: US 6,961,273 B2
(45) Date of Patent: Nov. 1, 2005

(54) RAM MEMORY CIRCUIT HAVING A PLURALITY OF BANKS AND AN AUXILIARY DEVICE FOR TESTING

(75) Inventors: Sven Boldt, Williston, VT (US); Johann Pfeiffer, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/012,927

(22) Filed: Dec. 14, 2004

(65) Prior Publication Data

US 2005/0152194 A1    Jul. 14, 2005

Related U.S. Application Data

(63) Continuation of application No. PCT/EP03/05393, filed on May 23, 2003.

(30) Foreign Application Priority Data

Jun. 14, 2002 (DE) ............................... 102 26 585

(51) Int. Cl.$^7$ .............................................. G11C 29/00
(52) U.S. Cl. .................................. 365/201; 365/230.03
(58) Field of Search ........................... 365/201, 230.03

(56) References Cited

U.S. PATENT DOCUMENTS

| | | | |
|---|---|---|---|
| 4,742,490 A | | 5/1988 | Hoffmann |
| 5,757,809 A | * | 5/1998 | Kiso et al. .................. 714/718 |
| 5,956,277 A | * | 9/1999 | Roohparvar ................ 365/201 |
| 6,243,309 B1 | | 6/2001 | Shin |
| 6,252,805 B1 | | 6/2001 | So et al. |
| 6,256,241 B1 | | 7/2001 | Mehalel |
| 6,256,243 B1 | | 7/2001 | Savignac et al. |
| 2001/0000449 A1 | | 4/2001 | Satoh |
| 2001/0005014 A1 | | 6/2001 | Koshikawa |

OTHER PUBLICATIONS

German Patent Office Examination Report dated Apr. 25, 2003.
International Search report dated Sep. 29, 2003.
International Preliminary Examination Report dated Aug. 20, 2004.

* cited by examiner

Primary Examiner—Vu A. Le
(74) Attorney, Agent, or Firm—Patterson & Sheridan, L.L.P.

(57) ABSTRACT

One embodiment of the invention provides a RAM memory circuit having $k \geq 2$ banks, each of which having a multiplicity of memory cells and a selection device to simultaneously select groups of in each case $n \geq 2$ memory cells of the bank for the writing or reading of n parallel data. For the fast testing of all the banks, devices are included for the parallel switching of the banks such that reading and writing may be effected simultaneously at all the banks. For each bank, a dedicated evaluation device is included for comparing the n data respectively read out at the relevant bank with a reference information item, which is representative of the write data which have previously been written in at the currently selected memory cell group of the bank, and for providing a result information item, comprising $1 \leq m \leq n/k$ bits, each of which indicates whether a subset precisely assigned to it from m subsets of the n read data corresponds to a part of the reference information item which is precisely assigned to said subset.

20 Claims, 2 Drawing Sheets

RAM MEMORY CIRCUIT HAVING A PLURALITY OF BANKS AND AN AUXILIARY DEVICE FOR TESTING

CROSS-REFERENCE TO RELATED APPLICATIONS

This application is a continuation of co-pending PCT patent application No. PCT/EP 03/05393, filed 23 May 2003, which claims the benefit of German patent application serial number DE 102 26 585.2, filed 14 Jun. 2002. Each of the aforementioned related patent applications is herein incorporated by reference in their entireties.

BACKGROUND OF THE INVENTION

1. Field of the Invention

The invention relates to a random access memory (RAM) memory circuit which has a plurality of banks each having a multiplicity of memory cells and further contains an auxiliary device for testing. A preferred, but not exclusive, field of the invention is dynamic RAM memory circuits (DRAMs).

2. Description of the Related Art

The acronym "RAM" (derived from "Random Access Memory") is usually used to designate a data memory having a multiplicity of memory cells, each of which can store a datum and which can be accessed selectively and directly to selectively write in or read out data. In many cases, the memory cells are combined in a plurality of separate cell arrays, so-called "banks". Each of these banks has a dedicated cell selection device containing a network of switchable data paths and a network of selection control lines for controlling the switching functions in the data path network.

The selection device of a bank can be activated by a bank address and, in the activated state, responds to a cell address information item applied to select the memory cells identified ("addressed") thereby for a write or read operation. This selection is effected, in principle, by the selection device exciting selected selection control lines depending on the cell address information item to actuate assigned switches in the data path network and thereby to switch through data transfer paths between the addressed memory cells and a data bus assigned to the relevant bank ("bank bus").

On account of this selection process, write data, which are provided on the bank bus when a write command appears, finds their way into the addressed memory cells, and when a read command appears, the data contained in the addressed memory cells finds their way to the bank bus. The bank bus is typically a parallel bus for simultaneously transferring n data (or n bits), and the selection device is designed such that a group of n memory cells can in each case be addressed simultaneously and selected for writing or reading by means of one cell address information item. The bank buses can usually be connected selectively, depending on the bank address, via a bank multiplexer to a bidirectional data port containing n parallel data transfer channels which, for their part, are connected to n external data terminals of the memory circuit for the purpose of receiving and transmitting the data to be written in or read out.

To check the functionality of a RAM memory circuit, various tests are necessary at various stages of production. Such tests consist, in principle, in writing a specific datum in each case to each memory cell and, during subsequent read accesses, checking whether the data read out correspond to the data previously written in. Memory tests are typically carried out with the aid of external test units which operate according to a selectable test program to provide the respective address and data information items for the selection of the memory cells and for the data to be written in. Additionally, the external test units supply command bits for prescribing the respective operating mode of the memory circuit and generate strobe signals for interrogating the test results.

Ever larger storage densities result in ever longer test times per memory circuit. Since the test time is a significant cost factor, efforts are made to shorten it. A known contribution to shortening the test time consists in both the bank buses and the selection devices of all the banks being switched in parallel during the writing-in of the test data, so that each group of n write data is simultaneously written to the respectively addressed memory cell group of all the banks. A parallel operation of the bank buses cannot be carried out in read operation, however, because the read data from different banks would then be superposed on one another, so that errors cannot be discriminated.

Therefore, the prior art has been restricted to shortening the duration of the read operation by bridging the customary waiting times which have to be complied with between successive accesses to different memory cell groups in a bank. Specifically, before each new read access in a given bank, it is necessary to wait until the data-carrying lines in the selection device are brought to their mutual charging state again. To usefully bridge these waiting times, it is known to address the individual banks in a time-interleaved manner during read-out in such a way that, immediately after reading has been effected at one bank (i.e., before the waiting time has actually lapsed at said bank), another bank is accessed. However, this enables only a few percent of the total memory read-out time to be saved.

SUMMARY OF THE INVENTION

One aspect of the invention is directed to designing a RAM memory circuit provided with a plurality of memory banks such that the circuit may be tested in a shorter time than hitherto.

Accordingly, one embodiment of the invention provides a RAM memory circuit containing: $k \geq 2$ banks, each bank having a multiplicity of memory cells and a selection device to simultaneously select groups of $n \geq 2$ memory cells of the respective bank depending on a cell address information item applied and, at the respectively selected memory cell group, to write in a group of n data, via an assigned n-bit bank bus, as write data in a write operation or to read out said group as read data in a read operation; a bidirectional data port with n transfer channels which are designed for receiving and transmitting n parallel data and can be connected to selectable specimens of the bank buses; a test auxiliary device, which has a bus parallel switching device for simultaneously connecting all k bank buses to the data port and a selection parallel switching device for simultaneously activating the selection devices of all the banks. The test auxiliary device contains a test control circuit, which responds to a test mode setting signal to activate the bus parallel switching device only during the write operation, to decouple all the bank buses from the data port during the read operation, and to activate the selection parallel switching device during the write operation and during the read operation. Furthermore, the test auxiliary device contains for each bank a dedicated evaluation device for comparing the n read data that appear on the assigned bank bus with a reference information item, which is representative of the write data which have previously been written in at the currently selected memory cell group, and for providing a result information item, comprising 1≦m≦n/k bits, each of which indicates whether a subset precisely assigned to the respective bit from m subsets of the n read data corresponds to a part of the reference information item which is precisely assigned to the respective subset.

Here and below, the term "m subsets" of any overall set means m disjoint sets which, taken together, completely encompass all elements of the overall set. This also includes the case m=1; in this case, the (single) "subset" is identical to the overall set.

The test auxiliary device according to one embodiment of the invention enables a time-saving parallel operation of the memory banks not only during the writing-in of the test data, but also during reading. In a read operation, the selection of the memory cell groups proceeds in parallel at all the banks, but without parallel switching of the bank buses. During reading, none of the n-bit bank buses is connected to the n-bit data port. Each of the k n-bit read data groups which appear simultaneously on the k different bank buses is checked in a dedicated evaluation device to obtain k "compressed" test results which, taken together, contain at the most n bits, so that the test results may be output via the n-bit data port.

BRIEF DESCRIPTION OF THE DRAWINGS

The invention is explained in more detail below using exemplary embodiments with reference to drawings.

DETAILED DESCRIPTION OF THE PREFERRED EMBODIMENT

In the figures, identical types of elements and control signals are designated in each case by the same reference numbers or abbreviations, which are sometimes succeeded by numerals or letters, in some instances in square brackets [ ], for closer identification.

Figure 1:
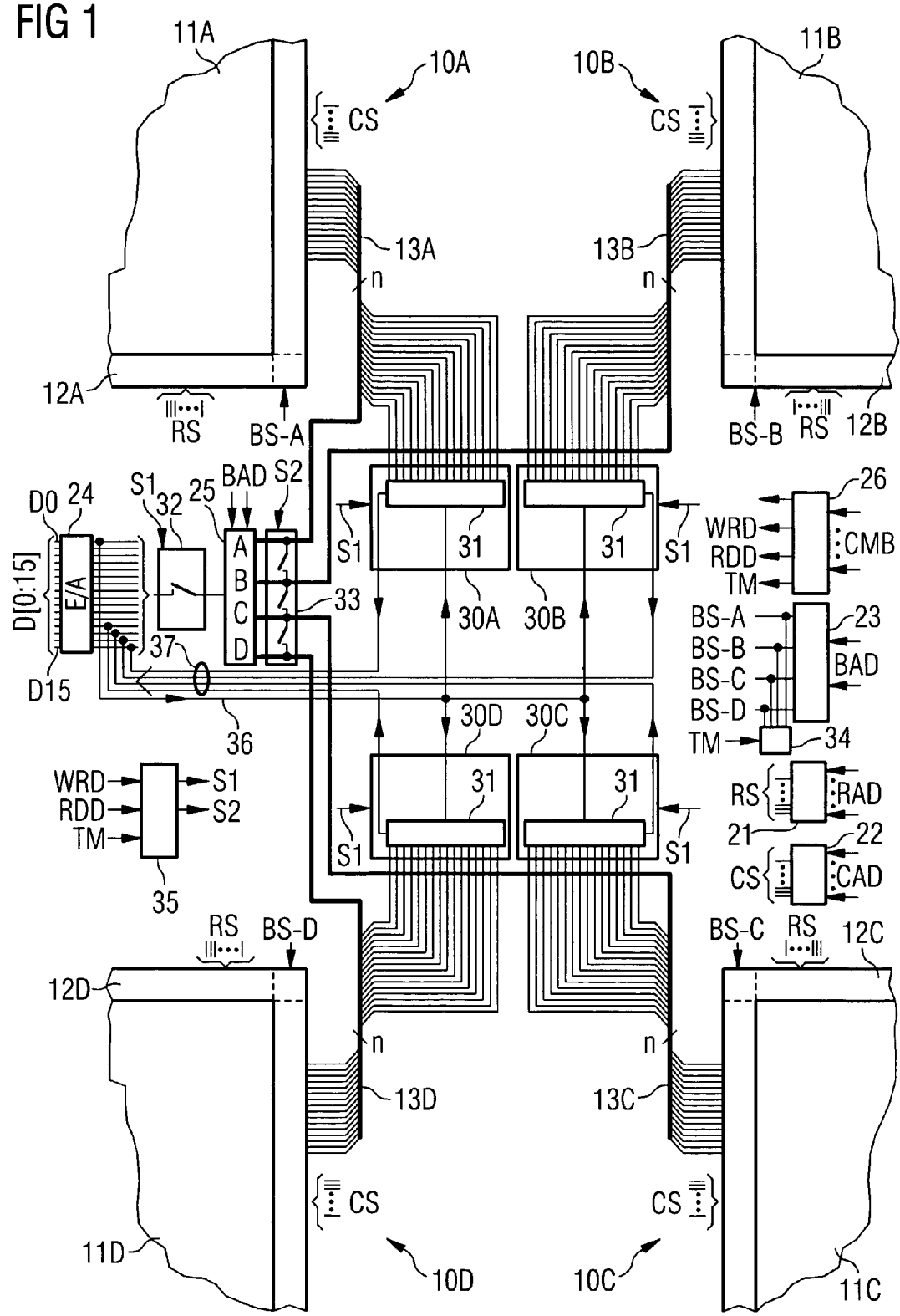
FIG. 1 is a schematic diagram showing the construction of a RAM memory circuit having four banks and a test auxiliary device in accordance with a first embodiment of the invention.

The memory circuit shown in FIG. 1 contains k=4 banks 10A, 10B, 10C and 10D, which are each illustrated in fragmentary fashion and are integrated together with other components of the memory circuit on a single semiconductor chip. Each of the four banks 10[A:D] lies in an assigned quadrant of the chip. The four banks have the same size and are constructed in the same way, so that a brief description just of the construction of the bank 10A suffices.

The bank 10A contains a cell array 11A with a large multiplicity of individual memory cells arranged in matrix form in rows and columns. Selected memory cells of the bank 10A are accessed for writing and reading via an assigned selection device 12A by the excitation of selected lines in multiple row select control lines RS and multiple column select control lines CS. The control lines RS are selectively excited by a row address decoder 21 depending on the bits of a row address RAD, and the control lines CS are selectively excited by a column address decoder 22 depending on the bits of a column address CAD. Upon activation by an assigned bank select signal BS-A, the selection device responds to the excitation states of the abovementioned control lines RS and CS in each case to connect a group of n memory cells of the cell array. The selected group is determined by the addresses RAD and CAD, to the n data lines of an assigned bank bus 13A. Via the n-bit data path thus created, n data bits may be simultaneously written in or read out at the relevant memory cell group. In the exemplary embodiment illustrated, n equals sixteen (n=16).

The other three banks 10B, 10C, 10D are also respectively assigned a dedicated n-bit bank bus 13B and 13C and 13D. The selection devices 12B, 12C, 12D of the three banks 10B, 10C, 10D are respectively connected in the same way as the selection device 12A of the bank 10A via the row select and column select control lines RS and CS to the two address decoders 21 and 22 and may be individually activated by a respectively assigned bank select signal BS-B and BS-C and BS-D. The bank select signals BS-[A:D] are generated by a bank address decoder 23 depending on the bits of a bank address BAD.

The memory circuit may have n=16 external data terminals D[0:15], which are connected to n parallel data transfer channels of a bidirectional data port 24. A bank multiplexer 25 having k branch terminals A, B, C and D may be controlled by the bank address BAD to connect the data port 24 to the bank bus of the respectively selected bank.

To control the sequence of the individual processes during different operating cycles, a control unit 26 is provided, which has inputs for receiving externally applied command bits CMB and derives operating control signals for different operating modes from the applied command bits. The operating control signals may include, inter alia, a write control signal WRD for activating the operation for writing data, a read control signal RDD for activating the operation for reading, and a test mode setting signal TM, which conditions the memory circuit specifically for carrying out test operations. The control unit 26 may also supply diverse timing control signals for the timing of the successive switching operations in the selection devices 12[A:D]. The corresponding signal connections are not illustrated separately, for reasons of clarity.

The features of the memory circuit described thus far are generally known and enable the customary normal operation for writing and reading data at a selected memory bank in each case. However, to carry out a memory test in a shortened time, the memory circuit according to FIG. 1 is additionally provided with a test auxiliary device containing k=4 identical evaluation devices 30[A:D], an n-pole switch 32 in the connection between the data port 24 and the multiplexer 25, a switching device 33 for the parallel switching of all k bank buses 13[A:D], a switching device 34 for parallel activation of all the selection devices 12[A:D] and a test control signal transmitter 35. The test control signal transmitter 35 combines the signals WRD, RDD and TM generated by the control part 26 to generate a first test control signal S1 for opening the switch 32 and activating the evaluation devices 30[A:D] and to generate a second test control signal S2 for the bus parallel switching device 33.

The four evaluation devices 30[A:D] are individually assigned to the four banks 10[A:D], and each evaluation device contains a comparator 31 with n signal inputs which are connected to the n data lines of the bank bus of the respectively assigned bank. The comparators 31 may be activated by the test control signal S1 to compare the n bits received at their respective signal inputs with a reference bit and to supply a result bit which indicates whether or not all the received n bits correspond to the reference bit. The reference bit for the comparators 31 of the four evaluation devices 30[A:D] may be fed, via a reference bit line 36 connected to one of the transfer channels of the data port 24, to the transfer channel of the data terminal D0 in the case illustrated. The result bits of the comparators 31 of the four evaluation devices 30[A:D] are conducted via four result lines 37, which are connected to four other transfer channels of the data port 24, to the transfer channels of the data terminals D[12:15] in the case illustrated.

The test mode setting signal TM may be kept inactive in the normal operating mode of the memory circuit. Under this condition, the selection parallel switching device 34 is inactive, and the test control signal transmitter 35 keeps the test control signals S1 and S2 inactive, so that the switch 32 remains closed, that the bus parallel switching device 33 remains inactive and that the evaluation devices 30[A:D] are all deactivated. A bank address BAD, a row address RAD and a column address CAD are applied via external address terminals to activate the selection device of the bank determined by the bank address BAD, so that the memory cell group (n=16 memory cells) of only this bank is selected, which group is determined by the addresses RAD and CAD. At the same time, the bank multiplexer 25 may be set by the bank address BAD such that the bank bus (e.g., of precisely the respective bank) is connected to the data port 24 (via the n-pole switch 32 that is closed in the normal mode). Consequently, a data transfer path for the parallel inputting of n write data or for the parallel outputting of n read data at the selected bank is produced between the n external data terminals D[0:15] and the n selected memory cells. The temporal sequence of the different switching operations in the respectively activated selection device for writing and reading is controlled by corresponding timing control signals which are generated in the control unit 26 under the influence of the write control signal WRD and read control signal RDD, respectively.

To carry out the memory test, the test mode setting signal TM may be made active and kept active during the entire test operation. This causes the selection parallel switching device 34 to keep the selection devices 12[A:D] of all the banks 10[A:D] active simultaneously, through simultaneous activation of all the bank selection signals BS-[A:D]. Any possible influence of bank address bits BAD on the bank selection signals BS-[A:D] may be overwritten by the activation on the part of the switching device 34.

The test operation begins with the writing of test data to the banks 10[A:D]. For this purpose, the write control signal WRD is made active, thereby causing the test control signal transmitter 35 to make the test control signal S2 active for the parallel switching of all the bank buses 13[A:D]. The other test control signal S1 remains in the "inactive" state during the write control signal WRD so that the switch 32 remains closed and the evaluation devices 30[A:D] remain deactivated. In this operating state, different cell address information items are applied successively, through different combinations of row and column address bits RAD and CAD. Together with each cell address information item, a group of n=16 test data bits having the same binary value is applied to the n data terminals D[0:15]. Owing to the abovementioned joint activation of all the selection devices 12[A:D] and owing to the abovementioned parallel switching of all the bank buses 13[A:D], each group of test data bits is simultaneously written to a memory cell group in each bank, which group is determined by the cell address information item applied. In this case, the bank multiplexer 25 may be "transmissive", which may be achieved, for example, by the application of an arbitrary bank address BAD.

This test write operation is followed by a test read operation. For this purpose, the read control signal RDD is made active, thereby causing the test control signal transmitter 35 to make the test control signal S2 inactive again and to make the other test control signal S1 active. As a result of this, the parallel switching of the bank buses 13[A:D] is cancelled; the switch 32 is opened; and all the evaluation devices 30[A:D] are activated. In this operating state, the different cell address information items which were also applied in the test write operation are again applied successively. Together with each cell address information item, a reference bit is applied to the data terminal D0, the reference bit having the same binary value as the group of n test data bits which was written in during the test write operation upon the application of the relevant cell address information item at all the banks 10[A:D].

Thus, with each application of a cell address information item in test read operation, the n read data from the addressed memory cell group of the respectively assigned bank appear at the n signal inputs of each comparator 31. The reference bit, which indicates what binary value the n read data should have at the comparator if no error is present, simultaneously appears at the reference input of each comparator 31. If there is correspondence between the binary values of all n read data and the reference bit at a comparator 31, the comparator supplies, at its output, the result bit with an information content "test passed", e.g., represented by the binary value "1". Otherwise, the comparator 31 supplies a "0", for example, representing the result "test failed".

The total of k (e.g., k=4) result bits from the comparators 31 of the k (e.g., k=4) evaluation circuits 30[A:D] pass via the four lines 37 and the data port 24 in parallel to the data terminals D[12:15]. Consequently, at the memory circuit, for each addressing, a "compressed" k-bit test result is output which indicates which of the k memory banks 10[A:D] passed or failed the test for the addressed memory cell group.

The above-described test auxiliary device—formed from the elements 30 to 37—in the memory circuit according to FIG. 1 thus allows a time-saving parallel testing of all the memory banks, in which case not only the test write operation but also the test read operation can proceed in parallel at all of the banks. Both the test write data and reference information for the test comparison and the result information can proceed via the data terminals provided for normal operation, so that there is no need for additional external terminals for the test mode. The compressed k-bit test result is meaningful since it indicates precisely which memory cell group in which of the k banks is defective.

Figure 2:
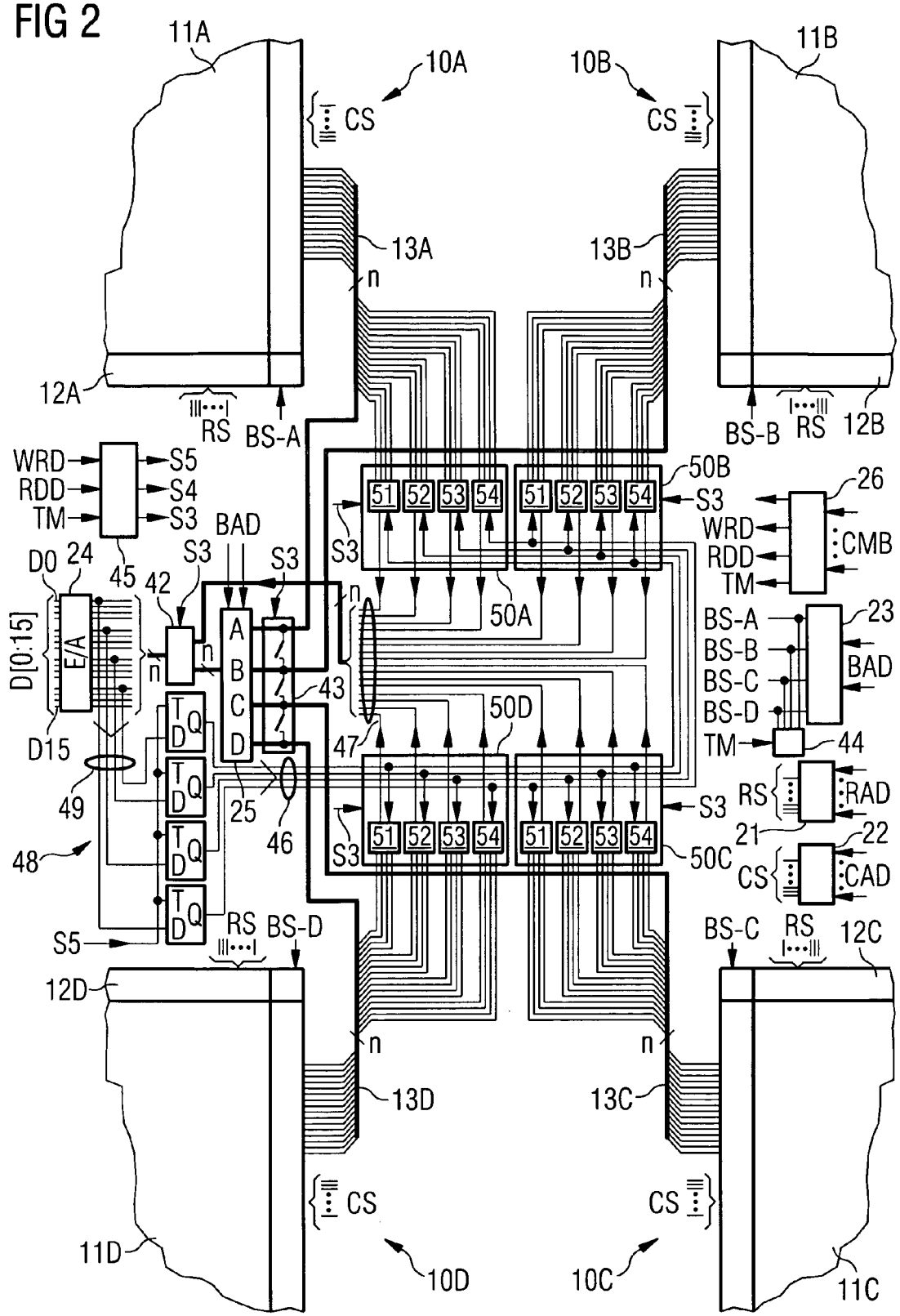
FIG. 2 is a schematic diagram showing the construction of a RAM memory circuit having four banks and a test auxiliary device in accordance with a second embodiment of the invention.

The meaningfulness of the test result can additionally be refined by providing a plurality of comparators in each of the k evaluation devices, wherein each comparator compares a disjoint subset of the n parallel read data from the relevant memory bank with a respective reference bit, so that a separate result bit is supplied for each of the subsets. FIG. 2 shows an example of an embodiment of the RAM memory circuit in this respect.

Many elements of the memory circuit according to FIG. 2 correspond to the embodiment shown in FIG. 1 and are designated by the same reference symbols as in FIG. 1. A repeated description of the construction and function of these elements is therefore superfluous. It suffices to discuss only the differences below, which lie solely in the construction and function of the test auxiliary device.

The test auxiliary device in accordance with FIG. 2 contains k=4 identical evaluation devices 50[A:D], a read/write multiplexer 42 between the data port 24 and the bank multiplexer 25, a switching device 43 for the parallel switching of all k bank buses 13[A:D], a switching device 44 for the parallel activation of all the selection devices 12[A:D], a latch register 48 and a test control signal transmitter 45. The test control signal transmitter 45 combines the signals WRD, RDD and TM generated by the control unit 26 to generate a control signal S3 for the operation of the read/write multiplexer switch 42 and the activation of the evaluation devices 50[A:D], a control signal S4 for activating the bus parallel switching device 43 and control signal S5 for triggering the latch register 48.

The four evaluation devices 50[A:D] are individually assigned to the four banks 10[A:D], and each evaluation device contains m comparators, where m is an integer fraction of the number n of memory cells in a memory cell group (i.e., n/m is an integer) and the product m*k is at most equal to n. In the case illustrated (n=16 and k=4), m=4. Consequently, k*m is exactly equal to 16.

Each of the m (e.g., m=4) comparators 51, 52, 53, 54 has p=n/m=4 signal inputs which are connected to an assigned subset of the n data lines of the bank bus of the assigned bank. The comparators 51–54 may be activated by the control signal S3 to compare the p bits received at their respective signal inputs with a reference bit and to supply a result bit which indicates whether or not all the received p bits correspond to the reference bit. The m reference bits for the m comparators 51–54 of each of the evaluation devices 50[A:D] are jointly fed to all of the evaluation devices via a bundle of m reference bit lines 46, to be precise from the m outputs of the latch register 48. The latch register 48 contains m triggerable data flip-flops whose data inputs are connected via m lines 49 to m different transfer channels of the data port 24, to the transfer channels of the four data terminals D0, D4, D7 and D12 in the case illustrated (wherein m=4).

The total of k*m=16 result bits from the m comparators of each of the four evaluation devices 50[A:D] are conducted via 16 result lines 47, which may be connected to the 16 transfer channels of the data port 24 via the read/write multiplexer 42, for the parallel outputting of the 16 result bits at the 16 data terminals D[0:15]. The read/write multiplexer 42 may be controlled by the control signal S3 to connect either the bank multiplexer 25 or the bundle of result lines 47 to the data port 24.

The test mode setting signal TM is kept inactive in the normal operating mode of the memory circuit according to FIG. 2. Under this condition, the selection parallel switching device 44 is inactive, and the test control signal transmitter 45 keeps the control signal S3 for the read/write multiplexer in a state for connecting the data port 24 to the bank multiplexer 25. The control signal S4 is kept in a state in which the bus parallel switching device 43 remains inactive, and the control signal S5 for triggering the flip-flops of the latch register is inhibited. Thus, the normal operation for writing and reading may be carried out in the same way as described above with reference to FIG. 1.

To carry out the memory test at the memory circuit according to FIG. 2, the test mode setting signal TM is made active and kept active during the entire test operation. This causes the selection parallel switching device 43 to keep the selection devices 12[A:D] of all of the banks 10[A:D] active simultaneously, through simultaneous activation of all of the bank selection signals BS[A:D].

The test operation begins with the writing of test data to the banks 10[A:D]. For this purpose, the write control signal WRD is made active, thereby causing the test control signal transmitter 45 to make the control signal S4 active for the parallel switching of all of the bank buses 13[A:D]. During the write control signal WRD, in the test mode, the control signal S3 is kept in a state in which it leaves the evaluation devices 50[A:D] inactive and causes the read/write multiplexer 42 to connect the data port 24 to the bank multiplexer 25. In this operating state, different cell address information items are applied successively, through different combinations of row and column address bits RAD and CAD. Together with each cell address information item, a group of n=16 test data bits is applied to the n data terminals D[0:15]. Owing to the abovementioned joint activation of all the selection devices 12[A:D] and owing to the above-mentioned parallel switching of all the bank buses 13[A:D], each group of test data bits is simultaneously written to a memory cell group in each bank, which group is determined by the cell address information item applied.

The following stipulations apply to the pattern of the n data bits which are written in parallel in each case in the test mode of the memory circuit according to FIG. 2;

a) the set of n write data bits is subdivided into m disjoint subsets, corresponding to the m subsets of the data lines in each bank bus, which are connected to the m comparators of the respectively assigned evaluation circuit;

b) all of the bits within each individual subset of the write data bits in each case have the same binary value, which, however, may be different from subset to subset; and c) in the successive write processes, the overall pattern of the n write data bits is the same during each test write operation.

To follow these stipulations on the memory circuit according to FIG. 2, throughout the test write operation, four data bits having the same binary value are applied to the first subset D[0:3] of the 16 data terminals; four data bits having the same binary value are applied to the second subset D[4:7]; four data bits having the same binary value are applied to the third subset D[8:11]; and four data bits having the same binary value are applied to the fourth (i.e., the m-th) subset D[12:15] of the 16 data terminals. Sometime during the test write operation (e.g., in a manner somewhat delayed after the generation of the write control signal), the test control signal transmitter 45 makes the control signal S5 active to trigger the m flip-flops of the latch register 48 and thereby to keep ready the m data bits present at the m subsets of the data terminals as reference bits at the m outputs of the register 48 for the subsequent read operation.

This test write operation is followed by the test read operation. For this purpose, the read control signal RDD is made active, thereby causing the test control signal transmitter 45 to activate the evaluation devices 50[A:D] by means of the control signal S3 and to set the read/write multiplexer 42 such that it connects the data port 24 to the n=16 result lines 47. In addition, in the test read operation, the test control signal transmitter 45 makes the bus parallel switching device 43 inactive by means of the control signal S4. The parallel switching of the bank buses 13[A:D] and the connection thereof to the data port 24 are thus cancelled.

In this operating state, the different cell address information items which were also applied in the test write operation are again applied successively. With each application of a cell address information item in the test read operation, m disjoint subsets of the n read data from the addressed memory cell group of the respectively assigned bank appear at the signal inputs of each of the m comparators 51–54 in each evaluation device 50[A:D]. The reference bit stored in the latch register 48 appears at the reference input of each comparator, which reference bit indicates what binary value the read data should have at this comparator if no error is present. If there is correspondence between the binary values of all the read data and the assigned reference bit at a comparator 31, this comparator supplies, at its output, the result bit with an information content "test passed", e.g., represented by the binary value "1". Otherwise, the comparator supplies a "0", for example, representing the result "test failed".

The total of k*m (=16) result bits from the total of k*m comparators of the evaluation circuits 30[A:D] pass via the sixteen (16) result lines 47 and the data port 24 in parallel to the data terminals D[0:15]. Consequently, at the memory circuit, for each addressing, a "compressed" 16-bit test result is output which indicates which of m subsets of the respectively addressed memory cell group in the respective k memory banks 10[A:D] passed or failed the test.

With the use of the test auxiliary device which is shown in FIG. 2 and may be formed from the elements 2 to 54, the test result—comprising n=16 bits—of each read process is less "compressed" and thus more finely meaningful than the test result comprising k=4 bits in the embodiment according to FIG. 1. The embodiment shown in FIG. 2 permits not only a defective memory cell group to be found, but also the discrimination of that subset or those subsets of a memory cell group in which the error is present (or the errors are present). Nevertheless, the test time is just as short as in the embodiment according to FIG. 1, and there is also no need for additional data terminals to output all of the result bits.

In the exemplary embodiments shown, the number n of simultaneously selectable memory cells is equal to 16, and the number k of banks is equal to 4. Of course, other numerical values for n and k are also possible. The following generally applies to the number m, which prescribes the number of comparators per memory bank, and thus, the number of subsets that can be discriminated per memory cell group:

The number m may be chosen arbitrarily, in principle, within the range $1 \leq m \leq n/k$ of natural numbers if the desire is to ensure that the number of result bits does not become greater than n and that all of the result bits may be output via the n data terminals provided for normal operation. If $m \leq n/(2k)$ is chosen (as in the case of m=1 in accordance with FIG. 1), the sum of m*k result bits and m reference bits does not exceed the number n of data terminals, so that, in the test read operation, all of the result bits may be output simultaneously, and there are still enough other data terminals remaining to simultaneously apply all m reference bits externally. With $m<n/(2k)$ as in the case of m=4 in accordance with FIG. 2, this condition is no longer met, and thus, an internal reference bit transmitter is required which may be programmed depending on the write data used in the test write operation, such as, e.g., the m-bit latch register 48 shown in FIG. 2. The abovementioned restriction that the n write data must remain unchanged throughout the test write operation applies to such cases.

In cases where m<1, it is also possible to manage with fewer than m reference bits if write data having the same binary value are allocated to a plurality of the m subsets in each memory cell group. The number of data terminals required for the reference bit inputting or the required bit width of the internal reference bit latch is correspondingly reduced as a result of this.

In one embodiment, the subdivision of each n-part memory cell group into m subsets be performed such that each subset has the same cardinal number p (i.e., comprises the same number of elements). In this case, the number m be chosen such that said cardinal number p=n/m is equal to 4 (as in the case of FIG. 2), and that each subset respectively comprises a quadruple of memory cells which is selected via a common column select control line. This is because the selection devices of most RAM memories that are customary at the present time are constructed for such quadruple selection. The consequence of this is that the replacement of defective rows and/or columns—which is customary for repairing faults—by connecting in redundant rows and/or columns, respectively, has to be effected with the inclusion of, in each case, whole memory cell quadruples. In this respect, the discrimination of quadruples during the memory test is sufficiently fine and optimal to be able to perform a targeted repair.

In the figures, for better clarity, the device for the parallel switching of the bank buses 13[A:D] is illustrated as a separate switching device 33 and 43, respectively downstream of the branch terminals of the bank multiplexer 25. In practice, the function of the bus parallel switching device may be implemented in the bank multiplexer itself. The same applies to the device for decoupling all of the bank buses 13[A:D] from the data port 24, which is illustrated purely symbolically in the figures as an n-pole switch 32 and, respectively, as a read/write multiplexer 42 between data port 24 and bank multiplexer 25. A customary bank multiplexer may be formed by relatively simple additional means in such a way that it is put into a switching state in which it connects all k branch terminals A, B, C and D to the main terminal, by the control signal S2 (FIG. 1) and, respectively, the control signal S4 (FIG. 2), and that it is put into a switched-off "dead" state, in which all k branch terminals are disconnected from one another and from the main terminal, by the control signal S1 (FIG. 1) and, respectively, the control signal S3 (FIG. 2).

In the fast test methods, as can be carried out on RAM memory circuits designed according to the invention, it must be taken into account, of course, that the respective test write data cannot have arbitrary bit patterns, rather that, depending on the embodiment of the test auxiliary device, specific subsets of the bits must have the same binary value and that, in many embodiments, the bit pattern must not be changed in the course of a test write operation. A customary test unit which can be used for carrying out the memory tests may readily be programmed such that, in addition to the required command bits CMB, it supplies the respectively desired or possible data bit patterns in the test write operation together with the respectively address information items, and that, in the test read operation, it processes the result bits output via the data terminals to indicate and log errors, and also supplies the matching reference bits via a portion of the data terminals (where possible).

While the foregoing is directed to embodiments of the present invention, other and further embodiments of the invention may be devised without departing from the basic scope thereof, and the scope thereof is determined by the claims that follow.

What is claimed is:

1. A random access memory circuit, comprising:
a plurality (k) of banks, each bank having a multiplicity of memory cells and a selection device configured to simultaneously select one or more groups of n memory cells of the respective bank, depending on a cell address information item applied, for one of a write operation and a read operation;

a bidirectional data port having n transfer channels for receiving and transmitting n data bits in parallel, the bidirectional data port selectably connected to a plurality of bank buses which are connected respectively to the plurality of banks; and a test auxiliary device comprising:

a bus parallel switching device for simultaneously connecting the plurality of bank buses to the data port;

a selection parallel switching device for simultaneously activating the selection devices of the plurality of banks;

a test control circuit, in response to a test mode setting signal, for activating the bus parallel switching device only during the write operation, decoupling the plurality of bank buses from the data port during the read operation and activating the selection parallel switching device during the write operation and during the read operation; and for each bank, a dedicated evaluation device for comparing n read data of the currently selected group of n memory cells of the respective bank and providing a result information item comprising m bits where $1 \leq m \leq n/k$, wherein each result information item indicates whether an assigned subset from m subsets of the n read data corresponds to a part of the reference information item which is assigned to the respective subset, wherein each evaluation device comprises m comparators.

2. The random access memory circuit of claim 1, wherein each comparator comprises:

a plurality of signal inputs for receiving a subset of the n read data which is assigned to the respective comparator;

a reference input for receiving a reference bit; and an output for supplying a result bit which indicates whether all of the n read data received at the signal inputs correspond to the reference bit.

3. The random access memory circuit of claim 2, wherein the test auxiliary device further comprises first connecting means for connecting the output of each comparator to the data port.

4. The random access memory circuit of claim 3, wherein $m*k \leq n/2$, and wherein the test auxiliary device further comprises second connecting means for connecting the reference input of each comparator to one of the transfer channels of the data port which is not affected by the first connecting means.

5. The random access memory circuit of claim 3, wherein $m*k=n$, and wherein the test auxiliary device further comprises a reference bit transmitter for providing the reference bits for the reference inputs of the m comparators simultaneously in all evaluation devices during the read operation.

6. The random access memory circuit of claim 5, wherein the reference bit transmitter is set, via a connection to the transfer channels of the data port, to the binary values of selected bits of the write data received on the respective transfer channels during the write operation.

7. The random access memory circuit of claim 1, wherein the memory cells of each bank are arranged in rows and columns, wherein each selection device is configured such that a quadruple of memory cells is selected via a common column select control line, and wherein a cardinal number of each subset is equal to 4 and each subset of the n read data is individually assigned to one quadruple of memory cells.

8. A random access memory circuit, comprising:

$k \geq 2$ banks, each bank having a multiplicity of memory cells and a selection device configured to simultaneously select one or more groups of $n \geq 2$ memory cells of the respective bank depending on a cell address information item applied and, at each respectively selected memory cell group, to write in a group of n data, via an assigned n-bit bank bus, as write data in a write operation and to read out the group of n data as read data in a read operation;

a bidirectional data port having n transfer channels for receiving and transmitting n parallel data, the bidirectional data port being connected to a plurality of selectable bank buses; and a test auxiliary device comprising:

a bus parallel switching device for simultaneously connecting all k bank buses to the data port;

a selection parallel switching device for simultaneously activating the selection devices of all banks;

a test control circuit, which responds to a test mode setting signal to activate the bus parallel switching device only during the write operation, to decouple all the bank buses from the data port during the read operation and to activate the selection parallel switching device during the write operation and during the read operation; and for each bank, a dedicated evaluation device for comparing the n read data of the currently selected group of n memory cells of the bank, which data simultaneously appear on the assigned bank bus with a reference information item which is representative of the write data which have previously been written to the currently selected group of n memory cells, and for providing a result information item comprising m bits, where $1 \leq m \leq n/k$ bits, wherein each result information item indicates whether an assigned subset from m subsets of the n read data corresponds to a part of the reference information item which is assigned to the respective subset, wherein each evaluation device contains m comparators, each comparator comprising:

a plurality of signal inputs for receiving a subset of the n read data which is assigned to the respective comparator;

a reference input for receiving a reference bit; and an output for supplying a result bit which indicates whether all of the read data received at the signal inputs correspond to the reference bit.

9. The random access memory circuit of claim 8, wherein the test auxiliary device further comprises first connecting means for connecting an output of each of the m*k comparators to one of the n transfer channels of the data port which is respectively assigned to the comparator.

10. The random access memory circuit of claim 9, wherein $m*k \leq n/2$, and wherein the test auxiliary device further comprises second connecting means for connecting the reference input of each of the m*k comparators to one of the transfer channels of the data port which is not affected by the first connecting means.

11. The random access memory circuit of claim 9, wherein $m*k=n$, and wherein the test auxiliary device further comprises a reference bit transmitter for providing the reference bits for the reference inputs of the m comparators simultaneously in all k evaluation devices during the read operation.

12. The random access memory circuit of claim 11, wherein the reference bit transmitter is set, via a connection to the transfer channels of the data port, to the binary values of selected bits of the write data received on the respective transfer channels during the write operation.

13. The random access memory circuit of claim 8, wherein the memory cells of each bank are arranged in rows and columns and each of the selection devices are configured such that a quadruple of memory cells is in each case selected via a common column select control line, and wherein a cardinal number of each subset is equal to 4 and each subset of the n read data is individually assigned in each case to one of the quadruples of memory cells.

14. A test auxiliary device for testing a memory circuit, comprising:
   a bus parallel switching device for simultaneously connecting a plurality of bank buses connected respectively to k memory banks to a bidirectional data port having n transfer channels;
   a selection parallel switching device for simultaneously activating a plurality of selection devices of the memory banks for one of a writing operation and a reading operation;
   a test control circuit, in response to a test mode setting signal, for activating the bus parallel switching device only during the write operation, decoupling the plurality of bank buses from the data port during the read operation and activating the selection parallel switching device during the write operation and during the read operation; and
   for each bank, a dedicated evaluation device for comparing n read data of a currently selected group of n memory cells of the respective bank and providing a result information item comprising m bits, where $1 \leq m \leq n/k$, wherein each result information item indicates whether an assigned subset from m subsets of the n read data corresponds to a part of the reference information item which is assigned to the respective subset, wherein each evaluation device comprises m comparators.

15. The test auxiliary device of claim 14, wherein each comparator comprises:
   a plurality of signal inputs for receiving a subset of the n read data which is assigned to the respective comparator;
   a reference input for receiving a reference bit; and
   an output for supplying a result bit which indicates whether all of the n read data received at the signal inputs correspond to the reference bit.

16. The test auxiliary device of claim 15, further comprising first connecting means for connecting the output of each comparator to the data port.

17. The test auxiliary device of claim 16, further comprising second connecting means for connecting the reference input of each comparator to one of the transfer channels of the data port which is not affected by the first connecting means.

18. The test auxiliary device of claim 16, further comprising a reference bit transmitter for providing the reference bits for the reference inputs of the m comparators simultaneously in all evaluation devices during the read operation.

19. The test auxiliary device of claim 18, wherein the reference bit transmitter is set, via a connection to the transfer channels of the data port, to the binary values of selected bits of the write data received on the respective transfer channels during the write operation.

20. The test auxiliary device of claim 14, wherein the test auxiliary device is integrated with the memory circuit.

* * * * *

UNITED STATES PATENT AND TRADEMARK OFFICE
CERTIFICATE OF CORRECTION

| | | |
|---|---|---|
| PATENT NO. | : 6,961,273 B2 | Page 1 of 1 |
| APPLICATION NO. | : 11/012927 | |
| DATED | : November 1, 2005 | |
| INVENTOR(S) | : Sven Boldt et al. | |

It is certified that error appears in the above-identified patent and that said Letters Patent is hereby corrected as shown below:

On the Title Page, Item (75), Inventors section, replace "Sven Boldt, Williston, VT (US)" with -- Sven Boldt, Aschheim (DE) --.

At Column 6, line15, replace "terminal DO" with -- terminal D0 --.

Signed and Sealed this

Twentieth Day of November, 2007

JON W. DUDAS
*Director of the United States Patent and Trademark Office*